United States Patent
Lisart

(10) Patent No.: US 7,251,151 B2
(45) Date of Patent: Jul. 31, 2007

(54) NON-VOLATILE MEMORY COMPRISING MEANS FOR DISTORTING THE OUTPUT OF MEMORY CELLS

(75) Inventor: Mathieu Lisart, Aix en Provence (FR)

(73) Assignee: STMicroelectronics S.A., Montrouge (FR)

( * ) Notice: Subject to any disclaimer, the term of this patent is extended or adjusted under 35 U.S.C. 154(b) by 69 days.

(21) Appl. No.: 11/106,048

(22) Filed: Apr. 14, 2005

(65) Prior Publication Data
US 2005/0232021 A1    Oct. 20, 2005

(30) Foreign Application Priority Data
Apr. 15, 2004    (FR) .................................. 04 03914

(51) Int. Cl.
*G11C 11/00* (2006.01)
(52) U.S. Cl. ...................................... 365/100; 365/195
(58) Field of Classification Search ................ 365/100, 365/195
See application file for complete search history.

(56) References Cited

U.S. PATENT DOCUMENTS

| | | | |
|---|---|---|---|
| 6,351,418 B1 * | 2/2002 | Tomohiro | 365/189.03 |
| 6,498,851 B1 * | 12/2002 | Wong | 380/266 |
| 6,792,528 B1 * | 9/2004 | Hou | 380/57 |
| 2002/0101763 A1 | 8/2002 | Hosogane et al. | 365/185.22 |
| 2005/0192453 A1 * | 9/2005 | Eckl et al. | 556/1 |
| 2006/0112418 A1 * | 5/2006 | Bantz et al. | 726/4 |

FOREIGN PATENT DOCUMENTS

| EP | 0 645 774 A2 | 3/1995 |
|---|---|---|
| WO | WO 98/53459 | 11/1998 |

* cited by examiner

*Primary Examiner*—Michael Tran
(74) *Attorney, Agent, or Firm*—Lisa K. Jorgenson; Eric M. Ringer; Seed IP Law Group PLLC

(57) ABSTRACT

The present invention relates to a non-volatile memory comprising a memory array comprising functional memory cells and non-functional memory cells linked to at least one non-functional word line. A word line address decoder comprises a special decoding section linked to the non-functional word line, for selecting the non-functional word line when a functional word line is read-selected, such that non-functional memory cells are selected simultaneously with the functional memory cells, and distort the reading of the functional memory cells. Application particularly to integrated circuits for smart cards.

35 Claims, 2 Drawing Sheets

NON-VOLATILE MEMORY COMPRISING MEANS FOR DISTORTING THE OUTPUT OF MEMORY CELLS

BACKGROUND OF THE INVENTION

1. Field of the Invention

The present invention relates to non-volatile memories, particularly electrically erasable and programmable memories of the EEPROM and Flash type.

2. Description of the Related Art

The use of electrically erasable and programmable non-volatile memories has become widespread in recent years, and such memories can be found in many integrated circuits. In certain applications, it is sometimes desired for it to be possible to erase the content of a non-volatile memory in a very short space of time when an unexpected or prohibited event occurs. Thus, integrated circuits for smart cards are equipped with memories of the aforementioned type in which confidential information is stored such as cryptography codes, passwords, identification data, etc. When an unauthorized read attempt occurs, provision is made to rapidly destroy the confidential information.

The destruction of the content of a non-volatile memory generally involves erasing the entire memory array. However, this solution has the disadvantage of taking a long time to implement, particularly in word-erasable EEPROM memories, as the memory array is erased word by word.

Thus, the present invention aims to provide a method enabling the content of a non-volatile memory to be rendered unavailable, without erasing the memory cells.

To this end, the present invention proposes providing a means for distorting data read during a reading of the data present in the memory rather than a destruction as such of said data. Such distortion can be reversible or irreversible.

It is well known that the memory array of a non-volatile memory includes memory cells connected to word lines and to bit lines. The bit lines are linked to sense amplifiers, and the value of the data read by the sense amplifiers in the memory cells varies according to the on or off state of the memory cells at the moment at which a read voltage is applied to them. The on or off state of a memory cell itself varies according to the programmed or erased state into which the memory cell has been put.

BRIEF SUMMARY OF THE INVENTION

To distort the reading of data in the memory array, one embodiment of the present invention is to provide non-functional memory cells connected to the bit lines of the memory array and which can be selected via a non-functional word line, and to select the non-functional memory cells at the moment at which functional cells are read-selected. Thus, the non-functional memory cells are simultaneously selected and interfere with the reading of the functional memory cells. The logic values supplied by the sense amplifiers are thus distorted, in whole or in part.

More particularly, the present invention provides a method for interfering with the reading of data in functional memory cells of a non-volatile memory array, wherein the non-functional memory cells are linked to functional word lines and to bit lines, the bit lines being linked to sense amplifiers, and wherein the value of a datum read by a sense amplifier in a memory cell varies according to the on or off state of the memory cell, which itself varies according to the programmed or erased state of the memory cell, the method including the steps of: providing non-functional memory cells linked to the bit lines of the memory array and to at least one non-functional word line enabling the non-functional memory cells to be selected, and when functional memory cells are read-selected, simultaneously selecting and engaging non-functional memory cells, such that the non-functional memory cells that are in the on state interfere with the reading of the functional memory cells that are in the off state, and cause the supply of distorted logic values at output of the sense amplifiers.

According to one embodiment, the method includes providing a word line address decoder having a special decoding section linked to the non-functional word line, for applying a selection signal to the non-functional word line when a functional word line is read-selected by the word line address decoder.

According to one embodiment, the method includes providing a special decoding section that is activated by a distortion-enabling signal, the non-functional memory cells not being selected while the special decoding section is not activated.

According to one embodiment, the method includes providing a register for storing a distortion-enabling bit the value of which determines the value of the distortion-enabling signal.

According to one embodiment, the method includes a step of configuring all of the non-functional memory cells into a programmed or erased state, so that all of the non-functional memory cells are in the on state when they are selected, so as to distort the reading of all of the functional memory cells.

According to one embodiment, the method includes a step of configuring only one part of the non-functional memory cells into a determined programmed or erased state, so that the non-functional memory cells are in the on state when they are selected, so as to distort the reading of only one part of the functional memory cells.

According to one embodiment, the non-functional word line is interspersed with the functional word lines, and finds itself in a location that can correspond to that of a functional word line.

According to one embodiment, the method includes providing non-functional memory cells having the same structure as the functional memory cells and which cannot be easily distinguished from the latter.

According to one embodiment, the method includes providing non-functional memory cells including dummy transistors having a drain-source short-circuit.

The present invention also relates to a non-volatile memory including a memory array having functional memory cells linked to functional word lines and to bit lines, the bit lines being linked to sense amplifiers, the word lines being coupled to a word line address decoder, the value of a datum read by a sense amplifier in a memory cell varying according to the on or off state of the memory cell, which itself varies according to the programmed or erased state of the memory cell, a memory wherein the memory array further includes non-functional memory cells linked to the bit lines of the memory array and to at least one non-functional word line, and the word line address decoder includes a special decoding section coupled to the non-functional word line, configured to select the non-functional word line when a functional word line is read-selected, such that non-functional memory cells are selected simultaneously with the functional memory cells and thus distort the reading of the functional memory cells.

According to one embodiment, the special decoding section of the word line address decoder is activated by a distortion-enabling signal, the non-functional memory cells not being selected while the special decoding section is not activated.

According to one embodiment, the memory includes a register for storing a distortion-enabling bit the value of which determines the value of the distortion-enabling signal.

According to one embodiment, the memory includes means for erasing and programming the non-functional memory cells, enabling non-functional memory cells to be selectively put into a determined erased or programmed state, such that the non-functional memory cells are on when they are selected.

According to one embodiment, the word line address decoder receives an extended word line address having at least one extra address bit relative to the number of address bits that the addressing of the functional word lines requires, and individually erase selects or program selects the non-functional word line when an extended address of predetermined value is applied to it.

According to one embodiment, the memory includes a central processing unit for decoding and executing an instruction for programming or erasing the non-functional memory cells.

According to one embodiment, the non-functional word line is interspersed with the functional word lines, and is configured in a location that can correspond to that of a functional word line.

According to one embodiment, the non-functional memory cells have the same structure as the functional memory cells and cannot be easily distinguished from the latter.

According to one embodiment, the non-functional memory cells include dummy transistors having a drain-source short-circuit.

The present invention also relates to an integrated circuit having a memory according to the present invention.

According to one embodiment, the integrated circuit includes means for activating the special decoding section of the word line address decoder when an unexpected or prohibited event occurs in the integrated circuit, such that data present in the memory array are read-accessible in a distorted form only. Such an event would be triggered when an unauthorized read of the memory is attempted.

The present invention also relates to a smart card including an integrated circuit according to the present invention.

BRIEF DESCRIPTION OF THE SEVERAL VIEWS OF THE DRAWINGS

These and other objects, features and advantages of the present invention will be explained in greater detail in the following description of an example of implementation of the method of the present invention in an EEPROM memory, and an example of implementation in a Flash memory, the present description being given in relation with the following figures.

DETAILED DESCRIPTION OF THE INVENTION

Below, "non-functional" shall designate memory cells which are not designed to store application data (user data) but which are designed to distort the reading of data in the memory array, and "functional"-shall designate the memory cells receiving application data.

Figure 1:
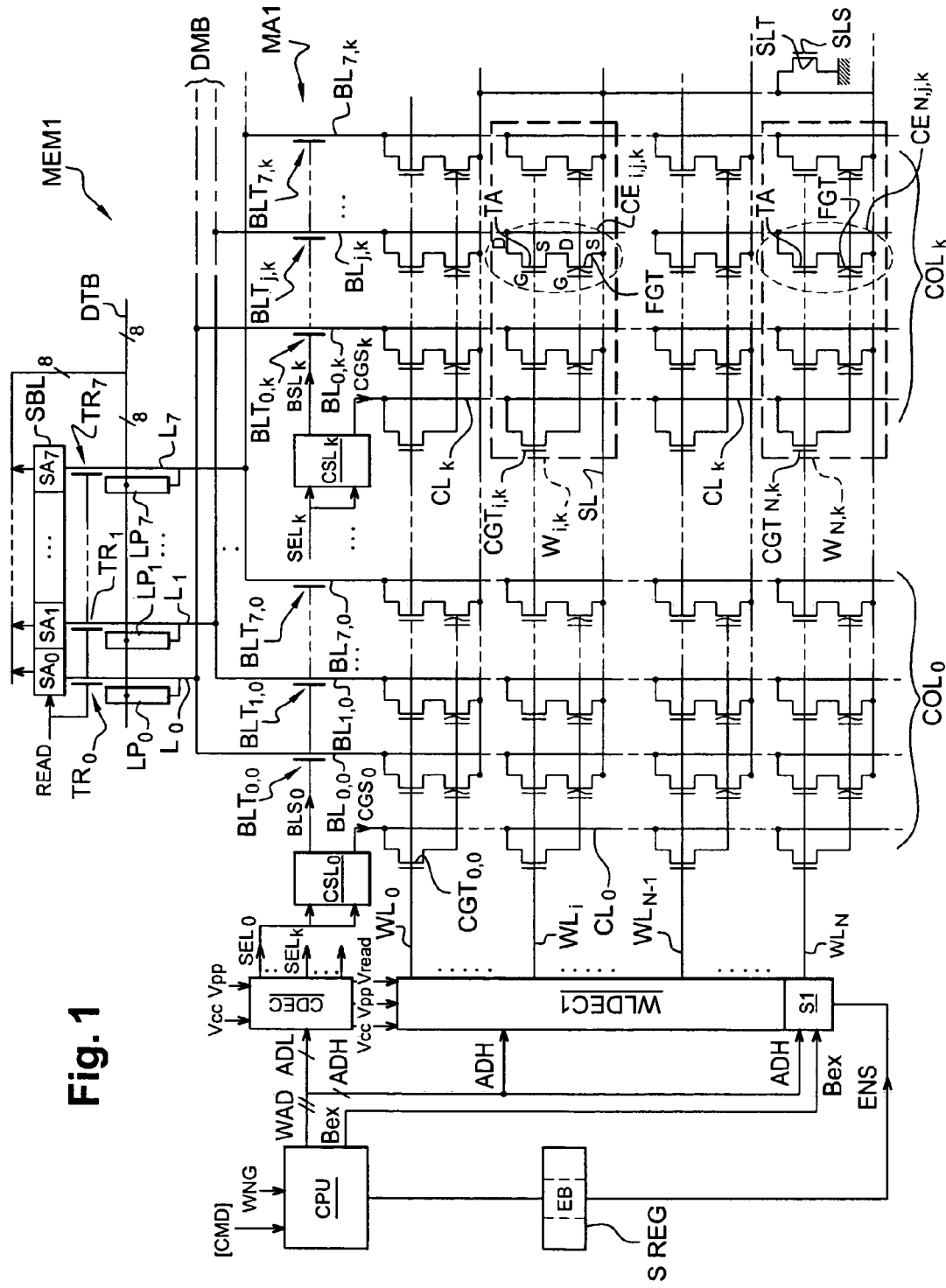
FIG. 1 schematically represents the architecture of an EEPROM memory according to the present invention, and FIG. 2 schematically represents the architecture of a Flash memory array according to the present invention.

FIG. 1 represents a non-volatile memory MEM1 of the EEPROM type (electrically erasable and programmable) in which the method of the present invention is implemented. The memory includes a memory array MA1, a word line address decoder WLDEC1 and a column decoder CDEC. The memory array MA1 includes functional memory cells $CE_{i,j,k}$ connected to functional word lines WLi and to bit lines $BL_{j,k}$. The memory array is here of the type programmable by words of 8 bits (bytes), such that the bit lines are grouped together in columns $COL_k$ each including 8 bit lines $BL_{0,k}$-$BL_{7,k}$ (j being an index ranging from 1 to 7 inside a column of rank k).

The memory array includes N functional word lines $WL_0$-$WL_{N-1}$ (i ranging from 0 to N−1), and a number of columns $COL_k$ corresponding to the number of bytes that it is desired to be able to save in a same row of cells (formed by cells connected to a same word line).

The memory array also includes an extra word line $WL_N$, or non-functional word line, that will be described below. First of all, the aspects of the memory that are classical per se will be described.

Each memory cell $CE_{i,j,k}$ includes a floating-gate transistor FGT and an access transistor TA. The access transistor TA has its gate G connected to a word line WLi, its drain D connected to a bit line $BL_{j,k}$, and its source S connected to the drain D of the transistor FGT. The control gate G of the transistor FGT is linked to a column selection line $CL_k$ through a gate control transistor $CGT_{i,k}$ the gate of which is connected to the word line WLi. The source of the transistor FGT is connected to a source line SL common to all of the memory cells, which can be taken to a floating potential or be connected to the ground by means of a transistor SLT driven by a signal SLS.

Each group of eight cells $CE_{i,j,k}$ forms a word $W_{i,k}$ that can be selected by means of the corresponding column selection line $CL_k$ and of the corresponding word line WLi. The control gates of the transistors FGT of the eight memory cells of the word are linked to a common gate control transistor $CGT_{i,k}$, and thus receive the same gate control signal $CGS_k$.

The word lines WLi are driven by the word line address decoder WLDEC1. The column selection lines $CL_k$ are controlled by column selection latches $CSL_k$, themselves driven by a column selection signal $SEL_k$ supplied by the column decoder CDEC. Each latch $CSL_k$ supplies two signals, respectively the gate control signal $CGS_k$, which is applied to the corresponding column selection line $CL_k$, and a bit line selection signal $BLS_k$ applied to bit line selection transistors described below.

The word line address decoder WLDEC1 receives a most significant address ADH, or word line address, and the column decoder CDEC receives a least significant address ADL, or column address. Together these two addresses form the address WAD of a word in the memory.

The memory MEM1 also includes eight programming latches $LP_0$-$LP_7$ and eight sense amplifiers $SA_0$-$SA_7$. The outputs of the amplifiers $SA_0$-$SA_7$ and the inputs of the latches $LP_0$-$LP_7$ are connected to a data bus DTB. This bus conveys data supplied by the sense amplifiers during reading phases, or data to be loaded into the programming latches before the programming phases. The outputs of the programming latches $SA_0$ to $SA_7$ are connected to lines $L_0$ to $L_7$ of corresponding rank. The inputs of the sense amplifiers are linked to the lines $L_0$-$L_7$ of corresponding rank through read transistors $TR_0$-$TR_7$ driven by a signal READ.

The lines $L_0$-$L_7$ are linked to the bit lines $BL_{0,k}$-$BL_{7,k}$ of each column $COL_k$ through a demultiplexing bus DMB. This bus DMB is arranged so as to create connection paths between, on the one hand, the output of each programming latch $LP_j$ ($LP_0$-$LP_7$) and the input of each sense amplifier $SA_j$ ($SA_0$-$SA_7$) and, on the other hand, the bit lines $BL_{j,k}$ of same rank j present in each of the columns. Each bit line $BL_{0,k}$-$BL_{7,k}$ of each column $COL_k$ is linked to the multiplexing bus through a bit line selection transistor $BLT_{0,k}$-$BLT_{7,k}$ of corresponding rank. The transistors $BLT_{0,k}$-$BLT_{7,k}$ belonging to a same column are driven by the bit line selection signal $BLS_k$ supplied by the latch $CSL_k$ for selecting the column in question.

In such a memory, an operation of erasing or programming a memory cell involves an injection or an extraction of electric charges by tunnel effect (Fowler Nordique effect) in the floating gate of the transistor FGT. The erasing operation is performed by applying an erase voltage Vpp in the order of 10 to 20 V to the gate G of the transistor FGT while the source line SLi is taken to the ground, the drain terminal being floating. The programming operation is performed by applying a programming voltage Vpp to the drain D of the transistor FGT, through the access transistor TA, while its gate is taken to the ground, the source terminal being floating.

During the erasing of the memory cells of a word $W_{i,k}$, the corresponding column selection latch $CSL_k$ is activated by the column selection signal $SEL_k$. The latch $CSL_k$ takes the gate control signal $CGS_k$ to the voltage Vpp and sets the bit line selection signal $BLS_k$ to 0 (ground). The decoder WLDEC1 applies the voltage Vpp to the selected word line WLi. The source line SL is connected to the ground. The transistors $BLT_{0,k}$-$BLT_{7,k}$ are off and the bit lines are disconnected from the programming latches and the sense amplifiers. The gate control transistor $CGT_{i,k}$ is on and the gates of the transistors FGT receive the voltage Vpp. Electric charges are extracted from the floating gates of the transistors FGT.

During the programming of the memory cells of the word $W_{i,k}$, the latch $CSL_k$ sets the gate control signal $CGS_k$ to 0 and takes the bit line selection signal $BLS_k$ to the voltage Vpp. The decoder WLDEC1 applies the voltage Vpp to the selected word line WLi. The source line SL is connected to the ground. The transistors $BLT_{0,k}$-$BLT_{7,k}$ are on and connect the outputs of the programming latches $LP_0$-$LP_7$ to the bit lines of the column. Each latch $LP_0$-$LP_7$ supplies the voltage Vpp or a zero voltage according to the value of the data bit that has been loaded into the latch beforehand. The transistor $CGT_{i,k}$ applies the gate control signal $CGS_k$ to the transistors FGT. Electric charges are injected into the floating gates of the transistors FGT, when the corresponding programming latches supply the voltage Vpp.

During the reading of the word $W_{i,k}$, the latch $CSL_k$ takes the signal $CGS_k$ to a read voltage Vread, while the bit line selection signal $BLS_k$ is taken to a determined voltage, such as the supply voltage Vcc of the memory for example. The decoder WLDEC1 applies the voltage Vcc to the selected word line WLi, the signal READ is set to 1 and the source lines SL are connected to the ground.

The transistors $TR_0$-$TR_7$ are on as well as the transistors $BLT_{0,k}$-$BLT_{7,k}$ such that the sense amplifiers $SA_0$-$SA_7$ are connected to the bit lines $BL_{j,k}$ of the selected column. The gate control transistor $CGT_{i,k}$ of the column is on and the read voltage Vread is taken to the gates of the transistors FGT. The access transistors TA are also on, such that the drains of the transistors FGT are connected to the inputs of the sense amplifiers.

A programmed transistor FGT has a negative threshold voltage VT1 and an erased transistor FGT has a positive threshold voltage VT2. The read voltage Vread is chosen to be higher than VT1 and lower than VT2. Thus, when the read voltage Vread is applied to the gate of a transistor FGT, the transistor remains off if it is in the erased state, which corresponds for example to a "1" being supplied at output of the corresponding sense amplifier. Conversely, the transistor FGT is on if it is in the programmed state, which corresponds for example to a "0" being supplied at output of the sense amplifier (the sense amplifiers being inverting or non-inverting according to the read convention chosen).

The memory array that has just been described has a classical architecture as far as the first N word lines $WL_0$-$WL_{N-1}$ are concerned, and is of the word-programmable and word-erasable type. Such architecture represents the most difficult case for the implementation of a process for destroying data in an emergency situation, since the words must be erased one after the other and the duration of the destruction process is long having regard to the time allowed to react to the data destruction request.

As indicated above, the memory MEM1 differs first of all from a classical memory in that at least one row of memory cells, here the row corresponding to the last word line $WL_N$, is formed by non-functional memory cells, which are not intended to store application data. These memory cells $C_{N,j,k}$ (i=N) here have a structure nearly identical to that of the functional memory cells, including as far as their connections to the word line $WL_N$ and to the bit lines $BL_{j,k}$ are concerned. These memory cells $C_{N,j,k}$ (i=N) provide misleading data bits to the data read which hinder a fraud or from determining the true value of the application data stored in the memory array.

The word line address decoder WLDEC1 includes a special decoding section S1 which controls the non-functional word line $WL_N$, and has an active state and an inactive state.

When the decoding section S1 is inactive, the memory operates in read mode like a classical memory and the word line $WL_N$ is never read-selected.

When the decoding section S1 is active, it applies the selection voltage, such as the voltage Vcc for example, to the word line $WL_N$. This application is performed permanently, or at least when an operation of reading the functional cells occurs. As indicated above, a read operation occurs when the decoder WLDEC1 applies the selection voltage Vcc to a functional word line $WL_k$ designated by the address ADH, and when a column selection line $CL_k$ receives the read voltage Vread.

In this case, as the words $W_{N,k}$ formed by the non-functional memory cells are also linked to the column selection lines $CL_k$, two read operations occur simultaneously in the same column:

1) the transistors FGT of the functional memory cells of the word $W_{i,k}$ designated by the address ADH, find themselves connected to the bit lines of the column concerned and receive the read voltage Vread at their gates, their sources being grounded, 2) the transistors FGT of the non-functional memory cells of a word $W_{N,k}$ of the same column $COL_k$, also find themselves connected to the bit lines of the selected column and also receive the voltage Vread at their gates, their sources also being grounded.

Thus, when the decoding section S1 is active, the input of each sense amplifier $SA_0$-$SA_7$ is connected to the drains of two floating-gate transistors FGT, i.e., the floating-gate transistor of the functional memory cell to be read, and the floating-gate transistor of the non-functional cell. If the non-functional cell is in the programmed state, the result of the reading is distorted since the floating-gate transistor of this memory cell is on and a current appears in the bit line (the drain-source voltage being supplied by the sense amplifier). The sense amplifier then supplies a bit equal to 0 irrespective of the conductivity state of the transistor of the functional memory cell.

Table 1 below summarizes what has just been described and gives the result of the reading of a functional memory cell when the decoding section S1 is inactive ("normal read") and when the decoding section S1 is active ("distorted read"). It can clearly be seen that a non-functional memory cell in the programmed state imposes the value 0 as the read result (Cf. last two lines of table 1). As indicated above, the on state of a memory cell here corresponds to the programmed state.

TABLE 1

| Operation | Functional memory cell | Non-functional memory cell | Result of the read |
|---|---|---|---|
| Normal read (section S1 inactive) | On | — | 0 |
|  | Off | — | 1 |
| Distorted read (section S1 active) | On | Off | 0 |
|  | Off | Off | 1 |
|  | On | On | 0 |
|  | Off | On | 0 |

In practice, the method according to the present invention can be implemented in two ways:

1) all of the non-functional memory cells are put into the programmed state, 2) only one part of the non-functional memory cells is put into the programmed state.

In the first case, the reading of any word of the memory array leads to obtaining the word "00000000" at output of the sense amplifiers, which is equivalent to a total destruction of the data present in the memory array. This virtual "destruction" according to the present invention is obtained almost immediately by the activation of the decoding section S1.

In the second case, the reading of non-functional memory cells leads to obtaining incorrect words including valid bits and incorrect bits. For a better understanding, the read superimposition of the following words will be considered:

0100 1111 (functional memory cells)

0011 0110 (non-functional memory cells)

As the "0"s prevails over the "1"s, the result of the read is the following:

0000 0110

The word read thus constitutes an incorrect piece of information that cannot be used by a fraudor.

The method according to the present invention thus enables a reading of data to be distorted in a way that is more difficult to detect than when all of the data read are on 0. Various applications of such data distortion are possible which go beyond the technical problem initially set out. One example of use involves putting a memory into a security mode during periods in which it is not supposed to be read-accessed. The distortion of the data can also be activated for any purposes when an integrated circuit is in a suspicious operating mode, for example when devices for monitoring the integrated circuit detect that unscheduled operations are performed by the integrated circuit.

The activation of the decoding section S1 can be obtained in various ways, and in a reversible or irreversible way. In FIG. 1, the memory here includes a CPU (central processing unit) which receives, decodes and executes commands CMD for accessing the memory, particularly erase, program and read commands. The activation of the decoding section S1 is provided to be reversible and is obtained by applying a distortion-enabling signal ENS to it. The enabling signal ENS is the image of an enabling bit EB stored by a state register SREG, which is managed by the CPU. More particularly, the CPU receives a warning signal WNG and is arranged for setting the bit EB to an active value when the warning signal WNG itself has an active value, for example 1. Such a warning signal, that is classical per se, is used in previous practices to trigger the erasing of the memory array. Here, it is used to activate the distortion of the reading of the data.

According to one optional aspect of the present invention, the decoding section S1 can also be used to erase and program control the non-functional word line $WL_N$, by applying the voltages described above (Vpp when erasing and Vcc when programming). In this case, the CPU is arranged for decoding and executing, in addition to the aforementioned classical commands, special commands aiming to erase or to program non-functional memory cells.

To this end, the word line address ADH is applied to the section S1. The address ADH includes n address bits enabling one of the N functional word lines $WL_0$-$WL_{N-1}$ to be designated, n being such that $N=2^n$. In addition to the address ADH, the decoding section S1 receives an address extension bit Bex supplied by the CPU. The address extension bit is concatenated with the address ADH to form an extended address of n+1 bits. The extended address enables 2N different addresses to be formed out of which the first N addresses (Bex=0) are reserved for the addressing of the N word lines $WL_0$-$WL_{N-1}$. Out of the remaining N addresses, one and only one address, kept secret, is dedicated to the selection of the word line $WL_N$ by the section S1, for the erase and program operations. In one alternative, the extension bit Bex can be used as a signal for selecting the section S1, without taking into account the address ADH. However, the risk of fraud by violation of the bit Bex is higher in this case.

The non-functional memory cells can be erased or programmed once and for all when the memory is commissioned, for example upon the execution of a test program which applies the aforementioned special commands to the CPU.

Other program or erase selection means can be provided, such as specific program or erase signals for example.

Various alternative embodiments of the present invention may be made. The floating-gate transistors FGT can, in particular, be replaced by antifuse elements (polysilicon-oxide-polysilicon sandwich) which become conductive after receiving a breakdown voltage. This breakdown voltage can be the programming voltage Vpp.

However, it is desirable, when the present invention is implemented for security purposes, for it to be difficult for the non-functional memory cells to be easily distinguished from the functional memory cells. The use of transistors or elements resembling transistors is desirable in this case, and furthermore, the non-functional word line, instead of being arranged as the last word line of the memory array, can be concealed within the memory array, in the middle of the functional word lines.

The non-functional memory cells can furthermore be not programmable or erasable, and be "pre-programmed" by construction. In particular, dummy floating-gate transistors FGT having a drain-source short-circuit can be provided. As such dummy transistors are continually on, they are equivalent to non-dummy transistors that are in the programmed state and that receive a read voltage at their gate.

In this case, the decoding section can include only a single antifuse element which, once broken down, permanently applies the voltage Vcc to the non-functional word line $WL_N$, such that the access transistors of the non-functional functional memory cells permanently connect the dummy transistors to the bit lines.

Finally, the present invention is also applicable to other types of memory, particularly to Flash memories.

Figure 2:
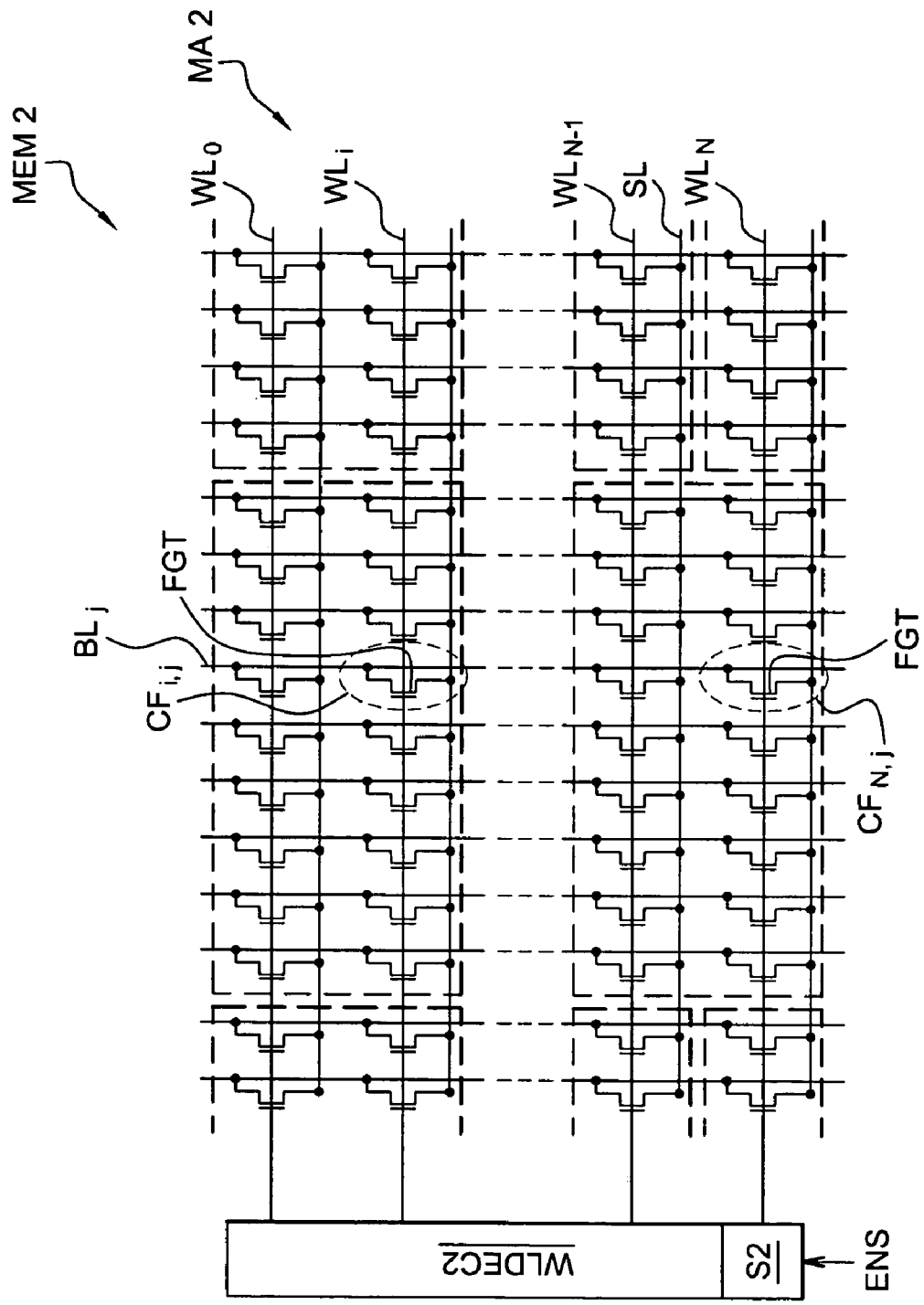

FIG. 2 schematically represents an example of a memory MEM2 of Flash type including a memory array MA2 according to the present invention. Like the previous one, this memory array includes a word line address decoder WLDEC2, bit lines $BL_j$, N functional word lines $WL_0$-$WL_{N-1}$ to which functional memory cells $CF_{i,j}$ are linked and a non-functional word line $WL_N$ according to the present invention to which non-functional memory cells $CF_{N,j}$ are linked. The memory cells $CF_{i,j}$, $CF_{N,j}$ differ from the previous ones in that they each include only one floating-gate transistor FGT the gate of which is directly connected to the corresponding word line $WL_i$, the drain of which is directly connected to the corresponding bit line BLi, and the source of which is connected to a source line. Like the previous one, the decoder WLDEC2 include a special decoding section S2 which controls the non-functional line $WL_N$.

In such a Flash memory, the bit lines are not grouped together in columns like in the EEPROM memory, such that the column index "k" is not included in the notation employed. The groups of bit lines containing the bits of a binary word are selected by bit line selection transistors, not represented in the Figure. The transistors FGT are programmed by hot carriers injection and erased by tunnel effect. A programmed transistor FGT here has a positive threshold voltage VT1 and an erased transistor FGT has a positive threshold voltage VT2 higher than VT1. The read voltage Vread applied to a selected word line $WL_i$ is chosen to be higher than VT1 and lower than VT2. Thus, while it is not activated, the special decoding section S2 maintains a zero voltage on the non-functional word line $WL_N$, and applies the read voltage Vread when it is activated, such that the nonfunctional memory cells in the programmed state distort the reading of the functional memory cells. In one alternative embodiment, when it is activated, the special decoding section applies a voltage higher than the threshold voltage VT2 of an erased transistor FGT to the non-functional word line $WL_N$, such that all of the transistors FGT forming the non-functional memory cells are then on, whether they are in the programmed or erased state.

It will be understood by those skilled in the art that various alternatives and applications of the present invention are possible.

The invention claimed is:

1. A method for interfering with the reading of data in a plurality of functional memory cells of a non-volatile memory array, where the functional memory cells are linked to functional word lines and to bit lines, the bit lines being linked to sense amplifiers, and wherein the value of a datum read by a sense amplifier in a memory cell varies according to the on or off state of the memory cell, which itself varies according to the programmed or erased state of the memory cell, the method comprising the steps of:

providing a plurality of non-functional memory cells linked to the bit lines of the memory array and to at least one non-functional word line enabling the non-functional memory cells to be selected, and when the functional memory cells are read-selected, simultaneously selecting non-functional memory cells, such that the non-functional memory cells that are in the on state interfere with the reading of the functional memory cells that are in the off state, and cause the supply of distorted logic values at output of the sense amplifiers.

2. The method of claim 1, further comprising the step of providing a word line address decoder including a special decoding section linked to the non-functional word line, for applying a selection signal to the non-functional word line when a functional word line is read-selected by the word line address decoder.

3. The method of claim 2, further comprising the step of providing a special decoding section that is activated by a distortion enabling signal, the non-functional memory cells not being selected while the special decoding section is not activated.

4. The method of claim 3, farther comprising the step of providing a register for storing a distortion enabling bit the value of which determines the value of the distortion enabling signal.

5. The method of claim 1, further comprising a step of assign all of the non-functional memory cells a determined programmed or erased state, so that all of the non-functional memory cells are in the on state when they are selected, so as to distort the reading of all of the functional memory cells.

6. The method of claim 1, further comprising a step of assigning only one part of the non-functional memory cells a determined programmed or erased state, so that the non-functional memory cells are in the on state when they are selected, so as to distort the reading of only one part of the functional memory cells.

7. The method of claim 1 wherein the non-functional word line is interspersed with the functional word lines, and is configured in a location that can correspond to that of a functional word line.

8. The method of claim 1, further comprising the step of providing non-functional memory cells having the same structure as the functional memory cells and which cannot be visually distinguished from the latter.

9. The method of claim 1, comprising providing non-functional memory cells comprising transistors having a drain-source short-circuit.

10. A non-volatile memory comprising a memory array comprising functional memory cells linked to functional word lines and to bit lines, the bit lines being linked to sense amplifiers, the word lines being linked to a word line address decoder, the value of a datum read by a sense amplifier in a memory cell varying according to the on or off state of the memory cell, which itself varies according to the programmed or erased state of the memory cell, a memory comprising:

a plurality of non-functional memory cells linked to the bit lines of the memory array and to at least one non-functional word line, and the word line address decoder including a special decoding section linked to the non-functional word line, configured to select the non-functional word line when a functional word line is read-selected, such that non-functional memory cells are selected simultaneously with the functional memory cells and distorting the reading of the functional memory cells.

11. The memory of claim 10, where the special decoding section of the word line address decoder is configured to be activated by a distortion-enabling signal, the non-functional memory cells not being selected while the special decoding section is not activated.

12. The memory of claim 10, further comprising a register for storing a distortion-enabling bit the value of which determines the value of the distortion-enabling signal.

13. The memory of claim 10, further comprising a means for erasing and programming the non-functional memory cells, enabling non-functional memory cells to be selectively put into a determined erased or programmed state, such that the non-functional memory cells are active when they are selected.

14. The memory of claim 10 wherein the word line address decoder is configured to receive an extended word line address comprising at least one extra address bit relative to the number of address bits that the addressing of the functional word lines requires, and individually erase or program selects the non-functional word line when an extended address of predetermined value is applied to it.

15. The memory of claim 10, comprising a central processing unit configured to decode and execute an instruction for programming or erasing non-functional memory cells.

16. The memory of claim 10 wherein the non-functional word line is interspersed with the functional word lines, and is configured in a location that can correspond to that of a functional word line.

17. The memory of claim 10 wherein the non-functional memory cells have the same structure as the functional memory cells and cannot be visually distinguished from the latter.

18. The memory of claim 10 wherein the non-functional memory cells further comprise transistors having a drain-source short-circuit.

19. An integrated circuit comprising a memory according to claim 10.

20. The integrated circuit of claim 19, comprising means for activating the special decoding section of the word line address decoder when a prohibited event occurs in the integrated circuit, such that data present in the memory array are read-accessible in a distorted form only.

21. A smart card comprising an integrated circuit according to claim 19.

22. A memory device comprising:
a plurality of first memory cells configured to store data; and
a second memory cell configured to output misleading data bits for distorting data stored in at least one of the first memory cells, during an unauthorized attempt to read the memory device, the second memory cell including at least one transistor having a drain and a source coupled to the drain.

23. The memory device of claim 22 wherein the second memory cell is programmable to an on or off state.

24. The memory device of claim 23 wherein the second memory cell includes at least one non-volatile transistor.

25. A smart card comprising:
a plurality of first memory cells configured to store data;
a second memory cell configured to output misleading data bits to a word, the word consisting of data stored in at least one of the first memory cells, during an unauthorized attempt to read the data stored in the smart card; and
logic configured to disable the second memory cell until an unauthorized attempt to read the smart card is detected, the second memory cell being comprised of at least one dummy transistor, and the at least one dummy transistor having:

a source; and
a drain coupled to the source.

26. The smart card of claim 25 wherein the second memory cell includes at least one non-volatile transistor.

27. A memory device comprising:
a plurality of first memory cells configured to store data;
a second memory cell configured to output misleading data bits to a word, the word consisting of data stored in at least one of the first memory cells, during an unauthorized attempt to read the memory device;
the first memory cells coupled to a plurality of first word lines and a plurality of bit lines;
a plurality of the second memory cells coupled to a second word line each of the second memory cells also being coupled to at least of the bit lines;
an address decoder configured to select word lines to be read; and
logic associated with the address decoder configured to read the second word line during an unauthorized read attempt.

28. The memory device of claim 27 further comprising:
an extended address, and
logic within the address decoder configured to distinguish an unauthorized read attempt based on the status of a bit within an extended address.

29. The memory device of claim 27 wherein the second memory cell includes at least one non-volatile transistor.

30. A memory device comprising:
a first functional memory cell linked a first bit line;
a first non-functional memory cell linked to the first bit line; and
selective memory cell reading means, linked to the first bit line, for simultaneously reading the first functional memory cell and the first non-functional memory cell when an unauthorized attempt to read the memory device is detected.

31. The memory device of claim 30 wherein the selective memory cell reading means includes a sense amplifier.

32. The memory device of claim 30 wherein the selective memory cell reading means includes logic to disable the first non-functional memory cell until the unauthorized attempt to read the memory device is detected.

33. The memory device of claim 32 wherein while the first non-functional memory cell is disabled, the selective memory cell reading means reads only the first functional memory cell.

34. The memory device of claim 30 wherein the first functional memory cell has a bit of data stored therein, the bit of data having a given value, wherein the first non-functional memory cell provides an output to the selective memory cell reading means when the unauthorized attempt to read the memory device is detected, and the selective memory cell reading means provides an output based upon the given value of the bit of data and the output of the first non-functional memory cell, the output of the selective memory cell reading means being different from the given value of the bit of data.

35. The memory device of claim 30 wherein in response to detecting the unauthorized attempt to read the memory device, the selective memory cell reading means permanently reads the first functional memory cell and the first non-functional memory cell.

* * * * *

UNITED STATES PATENT AND TRADEMARK OFFICE
CERTIFICATE OF CORRECTION

PATENT NO. : 7,251,151 B2  Page 1 of 1
APPLICATION NO. : 11/106048
DATED : July 31, 2007
INVENTOR(S) : Mathieu Lisart It is certified that error appears in the above-identified patent and that said Letters Patent is hereby corrected as shown below:

Column Ten
Line, 21, "farther" should read as -- further --

Signed and Sealed this

First Day of April, 2008

JON W. DUDAS
*Director of the United States Patent and Trademark Office*